(12) United States Patent
Wu

(10) Patent No.: US 12,191,593 B2
(45) Date of Patent: Jan. 7, 2025

(54) JUMPER TERMINAL BELT STRUCTURE

(71) Applicants: DINKLE ENTERPRISE CO., LTD., New Taipei (TW); DINKLE ELECTRIC MACHINERY (CHINA) CO., LTD., Jiangsu (CN); LI YANG ELECTRIC MACHINERY (DONGGUAN) CO., LTD., Dong Guan (CN)

(72) Inventor: Shang-Tsai Wu, New Taipei (TW)

(73) Assignees: DINKLE ENTERPRISE CO., LTD., New Taipei (TW); DINKLE ELECTRIC MACHINERY (CHINA) CO., LTD., Jiangsu (CN); LI YANG ELECTRIC MACHINERY (DONGGUAN) CO., LTD., Dong Guan (CN)

( * ) Notice: Subject to any disclaimer, the term of this patent is extended or adjusted under 35 U.S.C. 154(b) by 388 days.

(21) Appl. No.: 17/898,066

(22) Filed: Aug. 29, 2022

(65) Prior Publication Data
US 2024/0072474 A1    Feb. 29, 2024

(51) Int. Cl.
| | | |
|---|---|---|
| *H01R 31/08* | (2006.01) | |
| *H01R 4/28* | (2006.01) | |
| *H01R 13/05* | (2006.01) | |
| *H01R 13/516* | (2006.01) | |

(52) U.S. Cl.
CPC ............. *H01R 13/05* (2013.01); *H01R 4/28* (2013.01); *H01R 13/516* (2013.01)

(58) Field of Classification Search
CPC ......... H01R 13/05; H01R 13/516; H01R 4/28
USPC .......................................................... 439/507
See application file for complete search history.

(56) References Cited

U.S. PATENT DOCUMENTS

| | | | | |
|---|---|---|---|---|
| 4,726,787 | A * | 2/1988 | Stine ..................... | H01R 31/08 439/510 |
| 5,274,918 | A * | 1/1994 | Reed ..................... | H01R 43/24 29/418 |
| 5,669,788 | A * | 9/1997 | Brockman ........... | H01R 9/2675 439/511 |
| 6,402,548 | B1 * | 6/2002 | Ruiz ..................... | H01R 31/08 439/507 |
| 8,979,577 | B2 * | 3/2015 | Wu ..................... | H01R 9/2491 439/507 |
| 9,583,849 | B1 * | 2/2017 | Wu ..................... | H01R 9/2608 |
| 10,122,100 | B1 * | 11/2018 | Reeves ............... | H01R 9/2491 |
| 10,348,018 | B2 * | 7/2019 | Greenway ............ | H01R 13/10 |
| 10,367,271 | B1 * | 7/2019 | Wu ........................ | H01R 9/24 |

(Continued)

*Primary Examiner* — Abdullah A Riyami
*Assistant Examiner* — Vladimir Imas
(74) *Attorney, Agent, or Firm* — Chun-Ming Shih; HDLS IPR SERVICES

(57) ABSTRACT

A jumper terminal belt structure (10) includes a metal stamping member (1) and a soft insulative body (2). The metal stamping member (1) includes multiple jumper terminals (11) and multiple connecting bridges (12) connected between the multiple jumper terminals (11). The soft insulative body (2) includes multiple insulative seats (21) covering an end of each jumper terminal (11) and multiple tying portion (22) connected between the multiple insulative seats (21). Each connecting bridge (12) and each tying portion (22) are separated from each other and arranged at intervals. Therefore, the jumper terminal belt structure (10) has an advantage of being easily cut and flat incisions.

10 Claims, 8 Drawing Sheets

(56) References Cited

U.S. PATENT DOCUMENTS

| | | | |
|---|---|---|---|
| 10,770,809 B1* | 9/2020 | Wu | H01R 9/2416 |
| 10,950,965 B2* | 3/2021 | Annecke | H01R 13/7033 |
| 2005/0095904 A1* | 5/2005 | Reibke | H01R 9/2675 |
| | | | 439/507 |
| 2014/0057483 A1* | 2/2014 | Reineke | H01R 31/08 |
| | | | 439/507 |
| 2021/0005997 A1* | 1/2021 | Wu | H01R 13/41 |

* cited by examiner

JUMPER TERMINAL BELT STRUCTURE

BACKGROUND

Technical Field

The disclosure relates to a belt associating with multiple jumper terminals in parallel, particularly to a jumper terminal belt structure.

Description of Related Art

Modern electronic devices usually use a jumper to adjust connection and disconnection of different electric signals. In other words, a jumper is inserted into an electronic component (such as a pin) of an electronic device (such as a computer mother board, a hard disk drive or an optical disk drive) for switch of different electric signals.

Also, with the popularization of the computer applications and the continuous upgrade of the systems, the jumper terminals are applied more and more frequently. As a result, a jumper terminal belt appears in the market. The belt associates with multiple jumper terminals in parallel to allow users to cut the number of required jumper terminals.

However, junctions between the multiple jumper terminals of the belt are composed of a metal covered by rubber, so a user must cut off the rubber with a scissors first and then use his or her hands to break off the metal to cut off the junctions between the multiple jumper terminals, but a scissors may be blocked by the metal and unable to cut off the rubber. That may cause cutting difficulty or an uneven incision.

In view of this, the inventors have devoted themselves to the above-mentioned related art, researched intensively and cooperated with the application of science to try to solve the above-mentioned problems. Finally, the invention which is reasonable and effective to overcome the above drawbacks is provided.

SUMMARY

The disclosure provides a jumper terminal belt structure, which uses that each connecting bridge and each tying portion are separated from each other and arranged at intervals to accomplish the advantages of the jumper terminal belt structure being easily cut and having flat incisions.

In the embodiment of the disclosure, the disclosure provides a jumper terminal belt structure, which includes a metal stamping member and a soft insulative body. The metal stamping member includes multiple jumper terminals and multiple connecting bridges connected between the multiple jumper terminals. The soft insulative body includes multiple insulative seats covering an end of each jumper terminal and multiple tying portion connected between the multiple insulative seats. Each connecting bridge and each tying portion are separated from each other and arranged at intervals.

According to the above, the connecting bridge of the metal stamping member and the tying portion of the soft insulative body are separated from each other and arranged at an interval, when a user uses a scissors to cut the tying portion, the scissors is not blocked by the connecting bridge in the interval to make adjacent two of the insulative seats cut with a flat incision, then the user uses his or her hands to break off the connecting bridge to separate adjacent two of the jumper terminals to obtain the jumper terminals with a required quantity. Therefore, the jumper terminal belt structure has advantages of being easy to be cut and having a flat incision.

DETAILED DESCRIPTION

Figure 1:
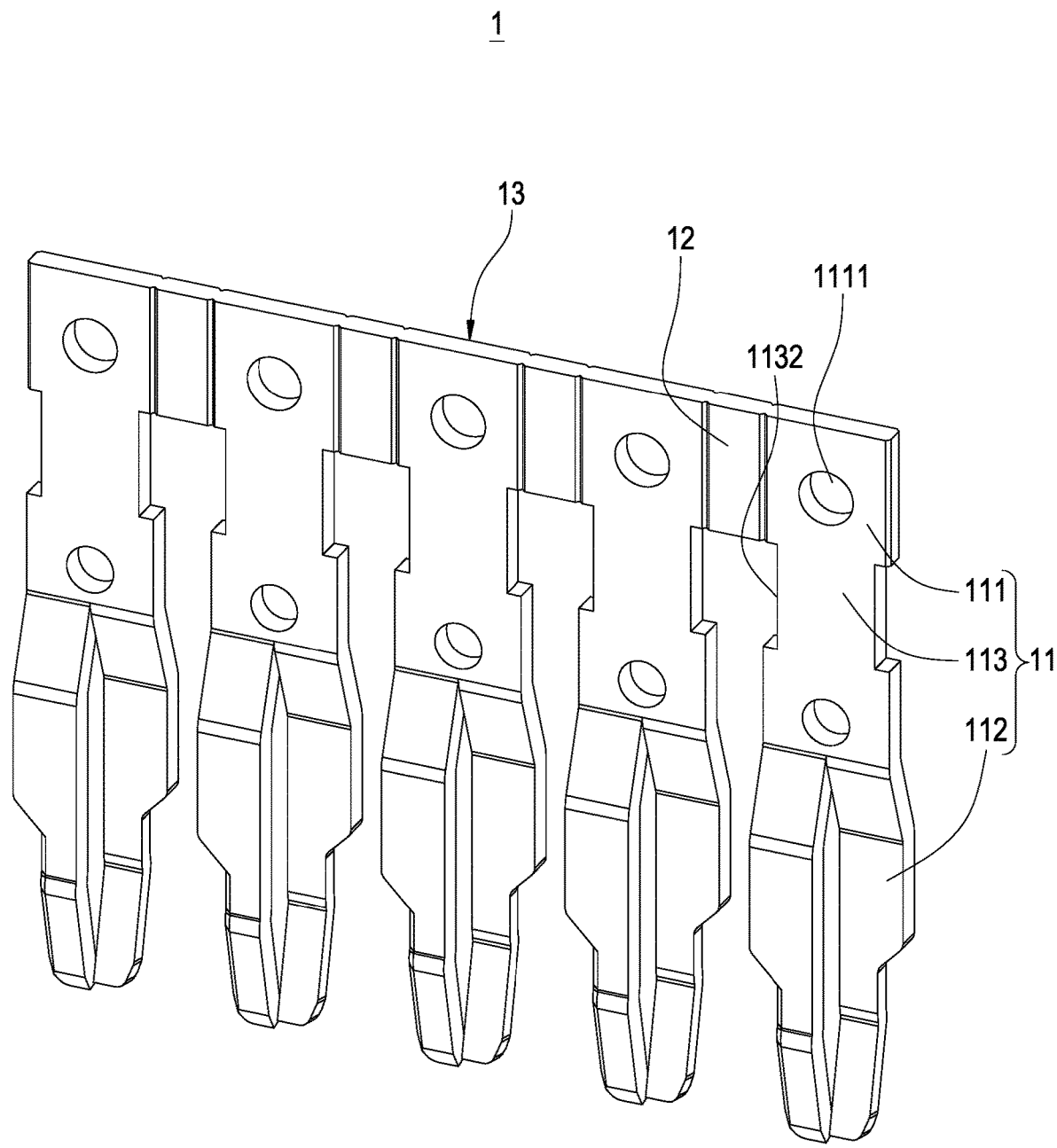
FIG. 1 is a perspective schematic view of the terminal set of the disclosure.
Figure 2:
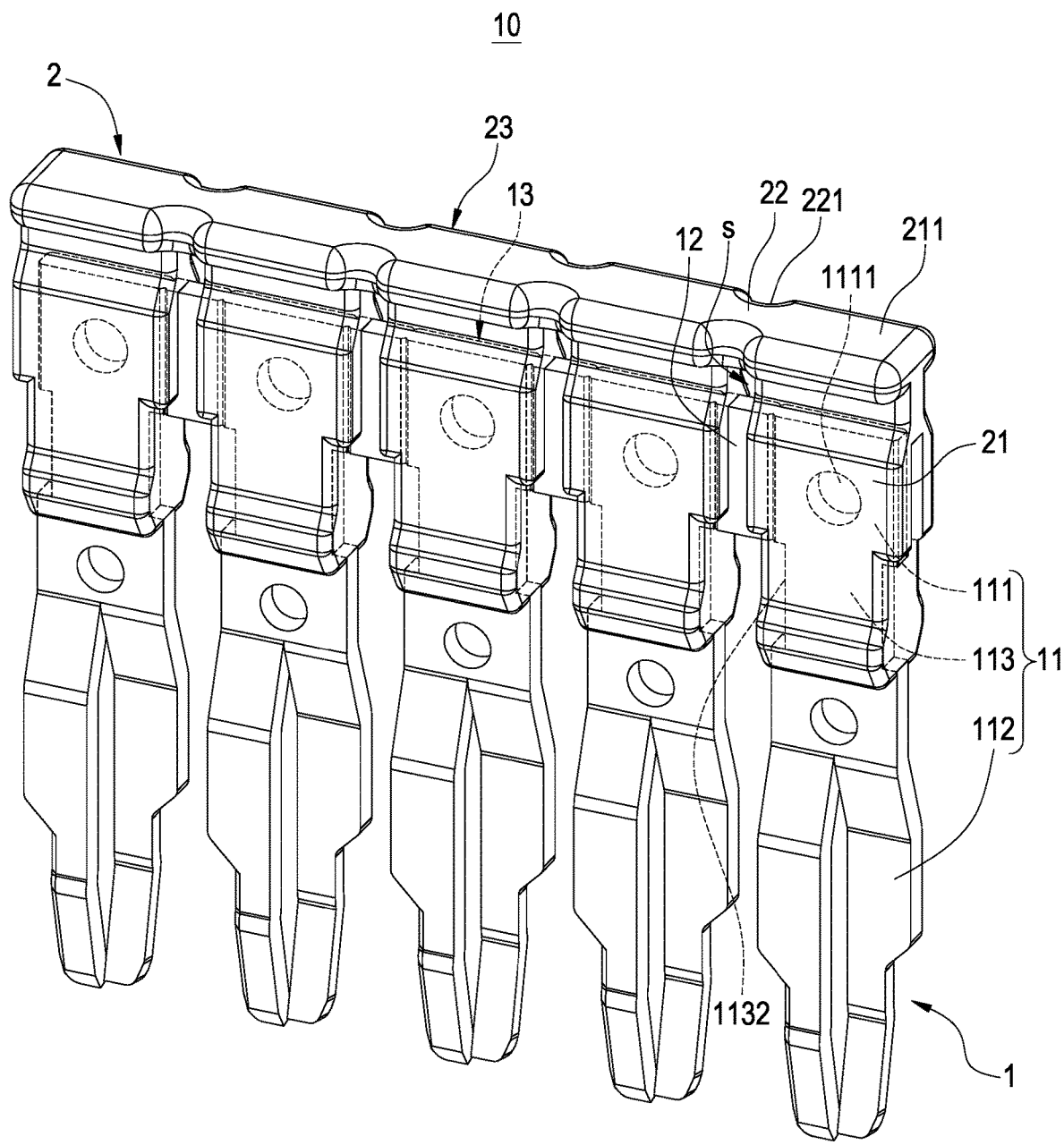
FIG. 2 is a perspective schematic view of the jumper terminal belt structure.
Figure 3:
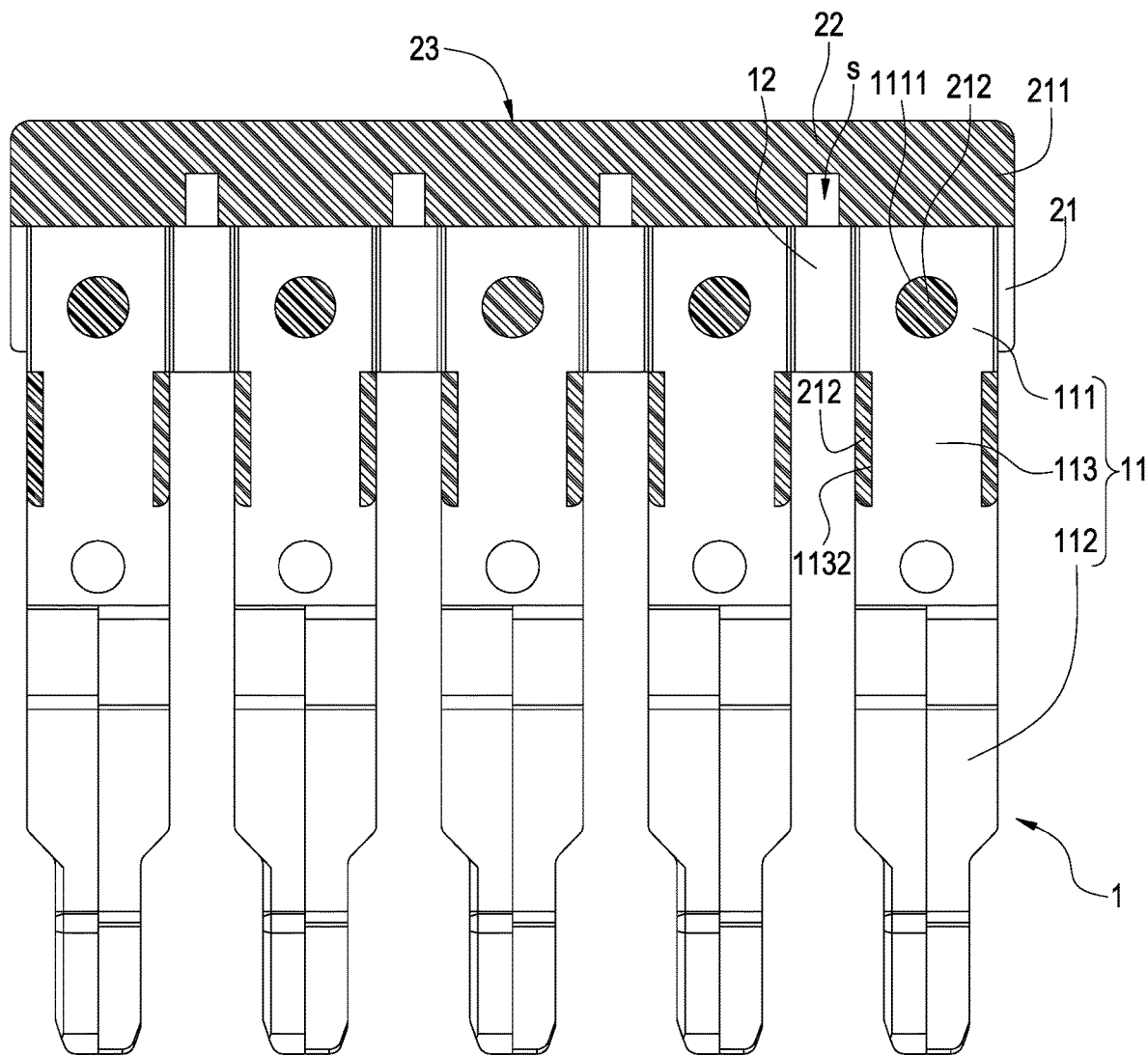
FIG. 3 is a cross-sectional schematic view of the jumper terminal belt structure.
Figure 4:
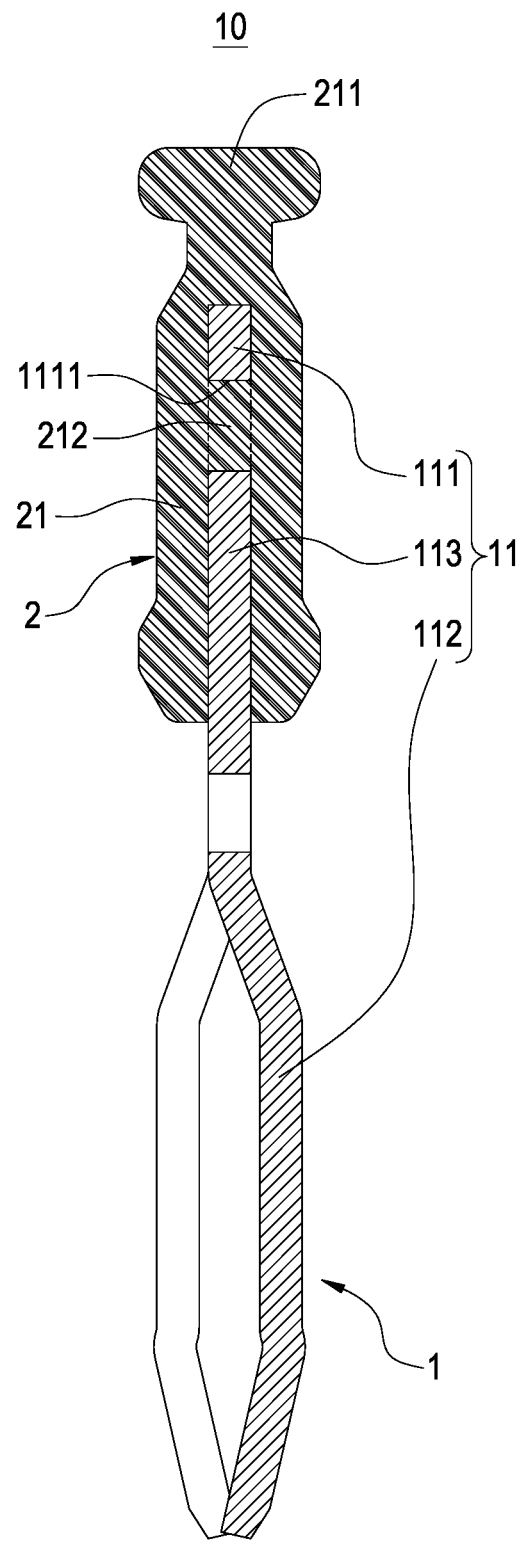
FIG. 4 is another cross-sectional schematic view of the jumper terminal belt structure.
Figure 5:
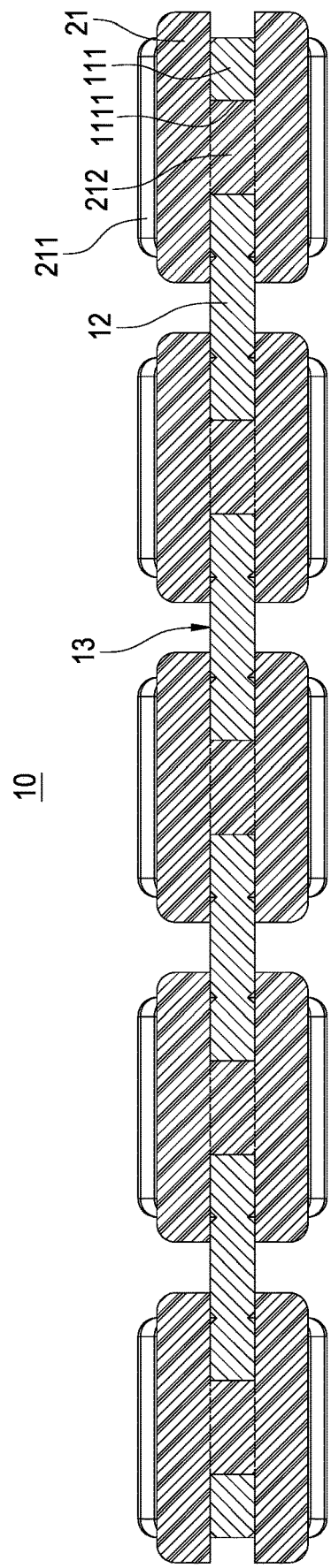
FIG. 5 is still another cross-sectional schematic view of the jumper terminal belt structure.
Figure 6:
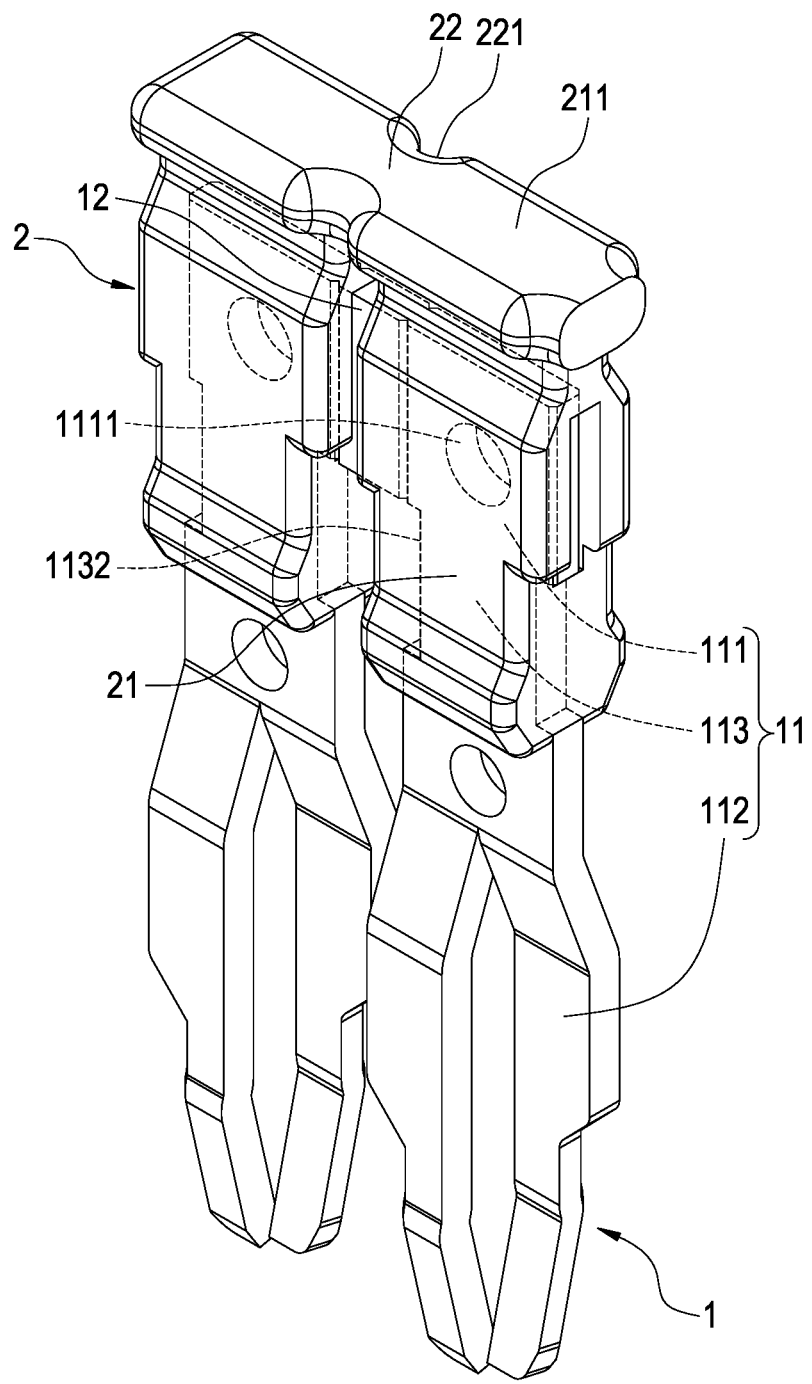
FIG. 6 is a schematic view of the jumper terminal belt structure in a using status.

The technical contents of this disclosure will become apparent with the detailed description of embodiments accompanied with the illustration of related drawings as follows. It is intended that the embodiments and drawings disclosed herein are to be considered illustrative rather than restrictive.

Please refer to FIGS. 1-6. The disclosure provides a jumper terminal belt structure. The jumper terminal belt structure 10 includes a metal stamping member 1 and a soft insulative body 2.

As shown in FIGS. 1-6, the metal stamping member 1 is made of metal material with high electrical conductivity, such as copper or silver. The metal stamping member 1 includes multiple jumper terminals 11 and multiple connecting bridges 12 connected between the multiple jumper terminals 11.

In detail, each jumper terminal 11 has a rear end section 111, a pair of elastic clamping pins 112 and a middle section 113 connected between the rear end section 111 and the pair of elastic clamping pins 112. Each connecting bridge 12 is connected between every adjacent two of the rear end sections 111 to jointly constitute a transverse strip 13.

As shown in FIGS. 2-6, the soft insulative body 2 is made of soft plastic material such as rubber or silicone. The soft insulative body 2 includes multiple insulative seats 21 separately covering an end of each jumper terminal 11 and multiple tying portions 22 connected between the multiple insulative seats 21. Each connecting bridge 12 and each tying portion 22 are separated from each other and arranged at intervals. That is, an interval s is formed between each connecting bridge 12 and each tying portion 22.

Furthermore, each insulative seat 21 covers each rear end section 111 and each middle section 113 by injection molding. An end of each insulative seat 21, which is away from each pair of elastic clamping pins 112, is extended with a block 211. Each tying portion 22 is connected between every adjacent two of the blocks 211 to jointly constitute a transverse rib 23.

In addition, each rear end section 111 is disposed with a through hole 1111. Each of two lateral sides of each middle section 113 is formed with a notch 1132. Each insulative seat 21 covers each rear end section 111 and each middle section 113 by injection molding, and thus each insulative seat 21 has multiple fillers 212 embedded in each through hole 1111 and each notch 1132 so as to make each insulative seat 21 be firmly connected to and cover an end of each jumper terminal 11.

Moreover, the block 211 may be used to be held by a user. Each block 211 is greater than each tying portion 22 in thickness to make each of an upper side and a lower side of each tying portion 22 form a dent 221 corresponding to each block 211.

As shown in FIGS. 2-6, a using state of the jumper terminal belt structure 10 utilizes that the connecting bridge 12 of the metal stamping member 1 and the tying portion 22 of the soft insulative body 2 are separated from each other and arranged at an interval s, when a user uses a scissors to cut the tying portion 22, the scissors is not blocked by the connecting bridge 12 in the interval s to completely cut off the tying portion 22 to make adjacent two of the insulative seats 21 be cut with a flat incision, then the user uses his or her hands to break off the connecting bridge 12 to separate adjacent two of the jumper terminals 11 to obtain jumper terminals 11 with a required quantity. Therefore, each connecting bridge 12 and each tying portion 22 are separated from each other and arranged at an interval, so the material belt 10 is easy to be cut and has a flat incision.

In addition, the block 211 is greater than the tying portion 22 in thickness to make each of an upper side and a lower side of each tying portion 22 form a dent 221 corresponding to each block 211, so that when a scissors is used to cut the tying portion 22, the scissors may be positioned by abutting against the two dents 221 to make adjacent two of the insulative seats 21 be cut off smoothly.

Figure 7:
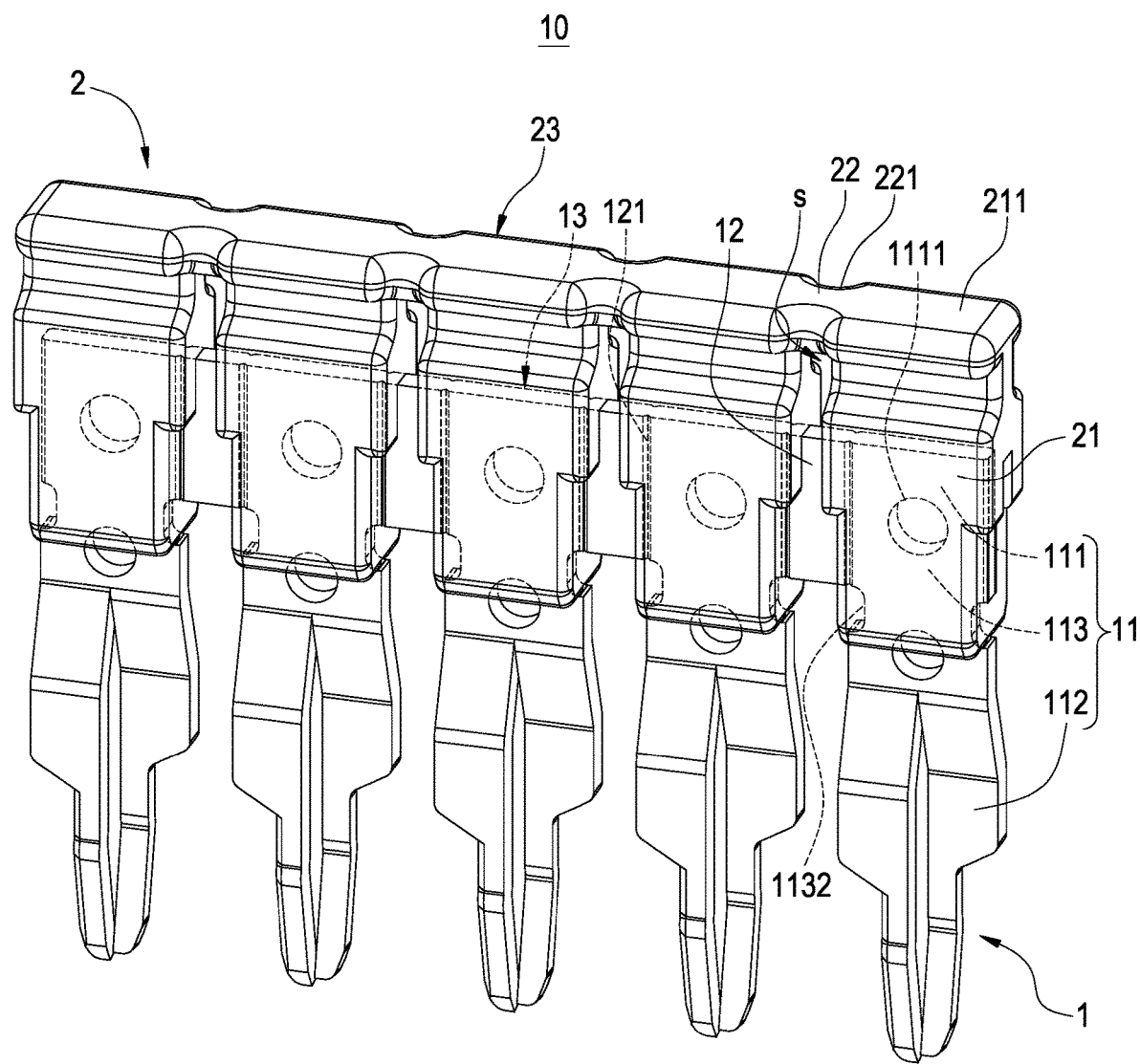
FIG. 7 is a perspective schematic view of another embodiment of the jumper terminal belt structure.

Please refer to FIG. 7, which is a perspective schematic view of another embodiment of the jumper terminal belt structure 10 of the disclosure. The embodiment of FIG. 7 is substantially the same as the embodiment of FIGS. 1-6. The embodiment of FIG. 7 differs from the embodiment of FIGS. 1-6 by each connecting bridge 12 being disposed with a pressing groove 121 which is arranged in a direction perpendicular to each tying portion 22 to make the connecting bridge 12 be easily broken off along the pressing groove 121 when a user bends the connecting bridge 12. This further makes two adjacent jumper terminals 11 be rapidly separated to enhance the effect of making the jumper terminal belt structure 10 be easy to be cut and have a flat incision.

Figure 8:
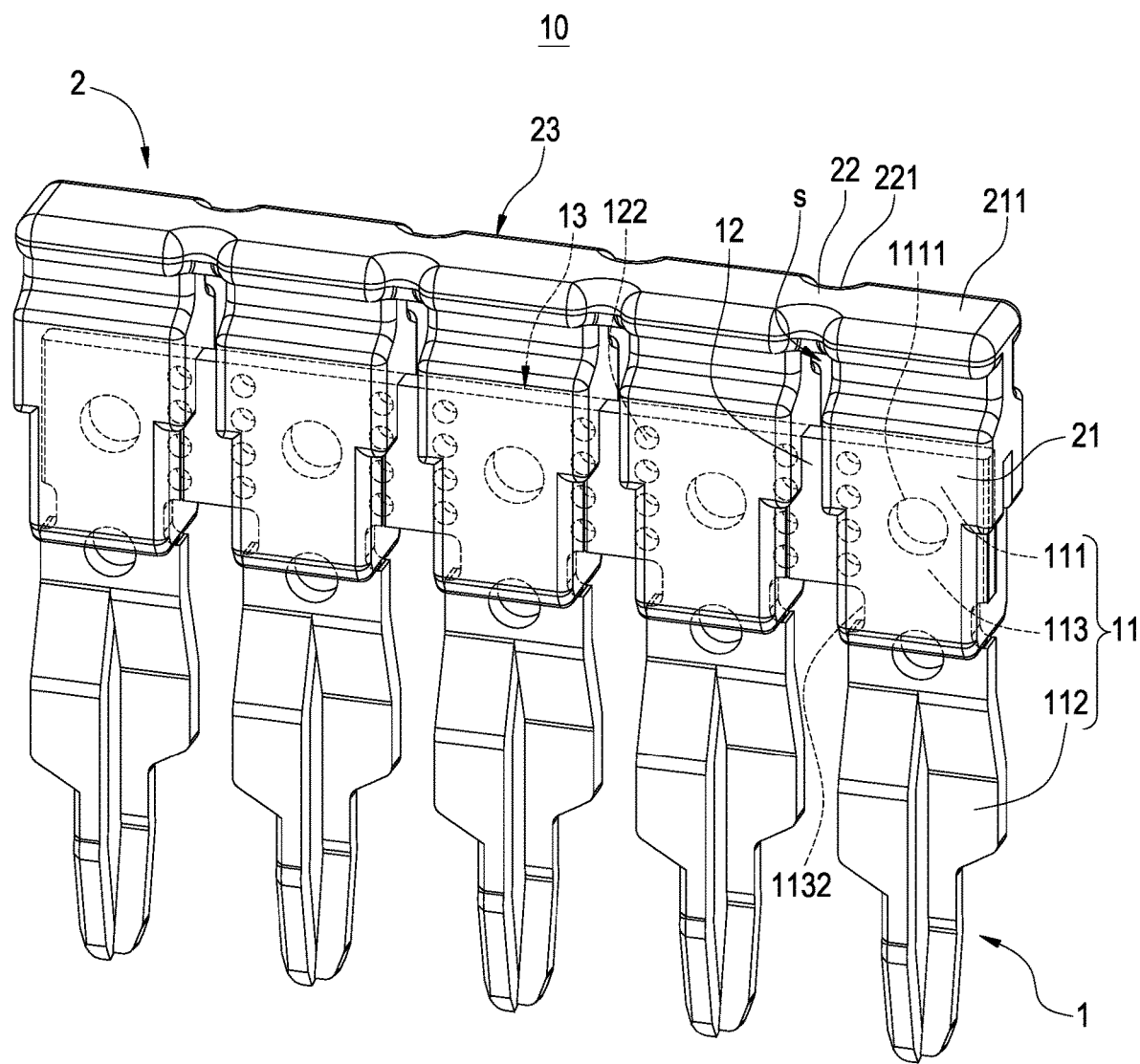
FIG. 8 is a perspective schematic view of still another embodiment of the jumper terminal belt structure.

FIG. 8 is a perspective schematic view of still another embodiment of the jumper terminal belt structure 10 of the disclosure. The embodiment of FIG. 8 is substantially the same as the embodiment of FIGS. 1-6. The embodiment of FIG. 8 differs from the embodiment of FIGS. 1-6 by each connecting bridge 12 being disposed with multiple breaking holes 122 which are arranged in a direction perpendicular to each tying portion 22 to make the connecting bridge 12 be easily broken off along the breaking holes 122 when a user bends the connecting bridge 12. This further makes two adjacent jumper terminals 11 be rapidly separated to enhance the effect of making the material belt 10 be easy to be cut and have a flat incision.

While this disclosure has been described by means of specific embodiments, numerous modifications and variations could be made thereto by those skilled in the art without departing from the scope and spirit of this disclosure set forth in the claims.

What is claimed is:

1. A jumper terminal belt structure, comprising:
   a metal stamping member (1), comprising multiple jumper terminals (11) and multiple connecting bridges (12) connected between the multiple jumper terminals (11); and
   a soft insulative body (2), comprising multiple insulative seats (21) covering an end of each jumper terminal (11) and multiple tying portion (22) connected between the multiple insulative seats (21), wherein each connecting bridge (12) and each tying portion (22) are separated from each other and arranged spacedly.

2. The jumper terminal belt structure of claim 1, wherein an interval (s) is defined between each connecting bridge (12) and each tying portion (22).

3. The jumper terminal belt structure of claim 1, wherein each jumper terminal (11) comprises a rear end section (111), a pair of elastic clamping pins (112) and a middle section (113) connected between the rear end section (111) and the pair of elastic clamping pins (112).

4. The jumper terminal belt structure of claim 3, wherein each connecting bridge (12) is connected between two rear end sections (111) adjacent to each other to jointly constitute a transverse strip (13).

5. The jumper terminal belt structure of claim 3, wherein each insulative seat (21) covers each rear end section (111) and each middle section (113).

6. The jumper terminal belt structure of claim 5, wherein an end of each insulative seat (21), which is away from each pair of elastic clamping pins (112), is extended with a block (211), and each tying portion (22) is connected between two blocks (211) adjacent to each other to jointly constitute a transverse rib (23).

7. The jumper terminal belt structure of claim 6, wherein each block (211) is greater than each tying portion (22) in thickness, and two dents (221) are respectively disposed on an upper side and a lower side of each tying portion (22) corresponding to each block (211).

8. The jumper terminal belt structure of claim 5, wherein each rear end section (111) is disposed with a through hole (1111), two notches (1132) are respectively disposed on lateral sides of each middle section (113), and each insulative seat (21) comprises multiple fillers (212) embedded in each through hole (1111) and each notch (1132).

9. The jumper terminal belt structure of claim 3, wherein each connecting bridge (12) comprises a pressing groove (121) arranged in a direction perpendicular to each tying portion (22).

10. The jumper terminal belt structure of claim 3, wherein each connecting bridge (12) comprises multiple breaking holes (122) arranged in a direction perpendicular to each tying portion (22).

* * * * *